United States Patent
Chen et al.

(10) Patent No.: US 12,452,624 B2
(45) Date of Patent: Oct. 21, 2025

(54) AUDIO PROCESSING METHOD AND SYSTEM, AND ELECTRONIC DEVICE

(71) Applicant: AAC Acoustic Technologies (Shanghai) Co., Ltd., Shanghai (CN)

(72) Inventors: Lianwu Chen, Shanghai (CN); Xuyang Li, Shanghai (CN); Xuejing Sun, L.A., CA (US)

(73) Assignee: AAC Acoustic Technologies (Shanghai) Co., Ltd., Shanghai (CN)

( * ) Notice: Subject to any disclaimer, the term of this patent is extended or adjusted under 35 U.S.C. 154(b) by 171 days.

(21) Appl. No.: 18/401,278

(22) Filed: Dec. 29, 2023

(65) Prior Publication Data

US 2025/0133365 A1  Apr. 24, 2025

Related U.S. Application Data

(63) Continuation of application No. PCT/CN2023/125921, filed on Oct. 23, 2023.

(51) Int. Cl.
*H04S 7/00* (2006.01)
*G06N 5/022* (2023.01)

(52) U.S. Cl.
CPC .............. *H04S 7/305* (2013.01); *G06N 5/022* (2013.01); *H04S 2420/01* (2013.01)

(58) Field of Classification Search
CPC ...... G06N 5/022; H04S 7/305; H04S 2420/01
USPC .......................................................... 381/303
See application file for complete search history.

(56) References Cited

U.S. PATENT DOCUMENTS

2024/0196159 A1* 6/2024 Eronen ................... G06F 3/012

* cited by examiner

*Primary Examiner* — Paul Kim
(74) *Attorney, Agent, or Firm* — Wiersch Law Group

(57) ABSTRACT

An audio processing method includes: determining a target tuning parameter of a target tuning scene based on tuning parameters corresponding to preset tuning scenes, wherein the tuning parameters are obtained based on adjustment values obtained by mapping space sizes of the corresponding preset tuning scenes; and performing reverberation tuning on an input audio signal based on the target tuning parameter, to obtain a final reverberation audio signal of the target tuning scene. According to the embodiments of the present disclosure, for a target tuning scene required to be simulated, any audio processing parameter can be adjusted and controlled based on a corresponding space size, thereby realizing simulation of reverberation effects of target tuning scenes with different space sizes and further meeting more abundant and more flexible requirements for simulation of reverberation effects of virtual scenes.

9 Claims, 1 Drawing Sheet

AUDIO PROCESSING METHOD AND SYSTEM, AND ELECTRONIC DEVICE

CROSS-REFERENCE TO RELATED APPLICATIONS

This application is a continuation of International Application No. PCT/CN2023/125921, filed on Oct. 23, 2023, which is hereby incorporated by reference in its entirety.

TECHNICAL FIELD

The present disclosure relates to the technical field of audio reverberation, and in particular, to an audio processing method, an audio processing system, and an electronic device.

BACKGROUND

When sound propagates in different acoustic scenes, different reverberation effects may be produced due to differences in space sizes and reflective surface materials. People mainly perceive acoustic scenes where they are located through details of reverberation, and judge sizes of spaces where they are currently located, such as a recording studio, a concert hall, or a stadium.

Sound that reaches a human ear through the shortest path from a sound source is called direct sound. In addition, the sound may form a reverberation signal through multiple reflections in a space. The reverberation signal is divided into early reflection and late reverberation. The early reflection refers to sound that has only been reflected once or twice. The late reverberation refers to a sound collection formed by multiple reflections.

In the design of sound effects, in the related art, it may be common to simulate hearing effects in different acoustic scenes by superimposing a specific reverberation signal on an original audio.

Common reverberation generation methods include a convolution reverberation method and an artificial reverberation method. The convolution reverberation method means measuring a room impulse response (RIR) of an actual scene in the scene, and then performing a convolution operation on a target audio and the RIR during generation of a sound effect, to reproduce a corresponding reverberation effect. With the convolution reverberation method, a realistic confusion effect can be achieved, with high complexity. The artificial reverberation method means simulating generation of reverberation through a model method, including early radiation, late reverberation, time delay, frequency attenuation characteristics, and the like, to simulate a reverberation effect of a target scene. The artificial reverberation method is more flexible and has low complexity.

In the related art, a virtual acoustic scene solution for an environment inside a vehicle is proposed. In the solution, a microphone signal and a music signal are inputted and processed by a pre-processing module to obtain an input signal required for artificial reverberation, then the input signal is processed by using a reverberation generation algorithm, to obtain a multi-channel artificial reverberation signal, and finally, the multi-channel artificial reverberation signal is processed by post-processing modules such as time delay, gain control, and dry and wet sound ratio mixing modules, to obtain final virtual scene audio output.

However, there are a large number of algorithm modules and parameters in the above solutions in the related art. In actual applications, each target virtual scene is required to be tuned separately, which requires more expert experience support and cannot meet flexible and diverse scene requirements.

SUMMARY

The present disclosure is intended to solve at least one of the problems existing in the related art to provide an audio processing method, an audio processing system, and an electronic device.

A first aspect of the present disclosure provides an audio processing method. The audio processing method includes:
  determining a target tuning parameter of a target tuning scene based on tuning parameters corresponding to preset tuning scenes; wherein the tuning parameters are obtained based on adjustment values obtained by mapping space sizes of the corresponding preset tuning scenes; and
  performing reverberation tuning on an input audio signal based on the target tuning parameter, to obtain a final reverberation audio signal of the target tuning scene.

In some embodiments, the determining a target tuning parameter of a target tuning scene based on tuning parameters corresponding to preset tuning scenes includes:
  selecting, from the preset tuning scenes, a first candidate tuning scene and a second candidate tuning scene based on the target tuning scene; wherein an adjustment value of the first candidate tuning scene is no greater than an adjustment value of the target tuning scene, and an adjustment value of the second candidate tuning scene is no smaller than the adjustment value of the target tuning scene; and
  performing interpolation processing based on the adjustment value of the first candidate tuning scene, a tuning parameter corresponding to the adjustment value of the first candidate tuning scene, the adjustment value of the second candidate tuning scene, and a tuning parameter corresponding to the adjustment value of the second candidate tuning scene, to obtain the target tuning parameter of the target tuning scene.

In an embodiment, the first candidate tuning scene is a tuning scene with an adjustment value no greater than the adjustment value of the target tuning scene and with a maximum adjustment value in the preset tuning scenes; and
  the second candidate tuning scene is a tuning scene with an adjustment value no smaller than the adjustment value of the target tuning scene and with a minimum adjustment value in the preset tuning scenes.

In an embodiment, the performing interpolation processing based on the adjustment value of the first candidate tuning scene, a tuning parameter corresponding to the adjustment value of the first candidate tuning scene, the adjustment value of the second candidate tuning scene, and a tuning parameter corresponding to the adjustment value of the second candidate tuning scene, to obtain the target tuning parameter of the target tuning scene includes:
  determining the target tuning parameter of the target tuning scene according to the following formula (1):

$$P(Vt)=(Vt-Vi)/(Vj-Vi)*(P(Vj)-P(Vi))+P(Vi) \qquad (1)$$

where $P(Vt)$ denotes a target tuning parameter corresponding to an adjustment value $Vt$ of a target tuning scene $t$, $P(Vi)$ denotes a tuning parameter corresponding to an adjustment value $Vi$ of a first candidate tuning scene $i$, and $P(Vj)$ denotes a tuning parameter corresponding to an adjustment value $Vj$ of a second candidate tuning scene $j$.

In an embodiment, the determining a target tuning parameter of a target tuning scene based on tuning parameters corresponding to preset tuning scenes includes:
   obtaining, based on the preset tuning scenes, tuning parameter estimates of key acoustic parameters through corresponding RIRs;
   obtaining an intermediate tuning parameter of the target tuning scene based on the tuning parameter estimates; and
   obtaining the target tuning parameter of the target tuning scene based on the intermediate tuning parameter and a pre-trained tuning parameter prediction model.

In an embodiment, the obtaining an intermediate tuning parameter of the target tuning scene based on the tuning parameter estimates includes:
   selecting, from the preset tuning scenes, a first intermediate tuning scene and a second intermediate tuning scene based on the target tuning scene; wherein an adjustment value of the first intermediate tuning scene is no greater than an adjustment value of the target tuning scene, and an adjustment value of the second intermediate tuning scene is no smaller than the adjustment value of the target tuning scene; and
   performing interpolation processing based on the adjustment value of the first intermediate tuning scene, a tuning parameter estimate corresponding to the adjustment value of the first intermediate tuning scene, the adjustment value of the second intermediate tuning scene, and a tuning parameter estimate corresponding to the adjustment value of the second intermediate tuning scene, to obtain the intermediate tuning parameter of the target tuning scene.

In an embodiment, the tuning parameter prediction model is trained according to the following steps:
   generating training data based on the tuning parameters corresponding to preset tuning scenes and the tuning parameter estimates corresponding thereto; and
   training the tuning parameter prediction model by taking the tuning parameter estimates in the training data as input and the tuning parameters in the training data as output, to obtain the pre-trained tuning parameter prediction model.

In an embodiment, the performing reverberation tuning on an input audio signal based on the target tuning parameter, to obtain a final reverberation audio signal of the target tuning scene includes:
   pre-processing the input audio signal based on a pre-processing parameter in the target tuning parameter, to obtain a reverberation input signal;
   reverbing the reverberation input signal based on a reverberation parameter in the target tuning parameter, and generating an initial reverberation audio signal of the target tuning scene;
   weighting and mixing, based on a weighted mixing parameter in the target tuning parameter, a dry sound signal in the input audio signal and the initial reverberation audio signal according to a preset ratio, to obtain an intermediate reverberation audio signal of the target tuning scene; and
   performing system tuning on the intermediate reverberation audio signal based on a system tuning parameter in the target tuning parameter, to obtain the final reverberation audio signal of the target tuning scene.

In another aspect of the present disclosure, an audio processing system is provided, wherein the audio processing system includes:
   a parameter control module configured to determine a target tuning parameter of a target tuning scene based on tuning parameters corresponding to preset tuning scenes; wherein the tuning parameters are obtained based on adjustment values obtained by mapping space sizes of the corresponding preset tuning scenes; and
   an audio generation module configured to perform reverberation tuning on an input audio signal based on the target tuning parameter, to obtain a final reverberation audio signal of the target tuning scene.

In an embodiment, the parameter control module being configured to determine a target tuning parameter of a target tuning scene based on tuning parameters corresponding to preset tuning scenes includes:
   the parameter control module being configured to:
   select, from the preset tuning scenes, a first candidate tuning scene and a second candidate tuning scene based on the target tuning scene; wherein an adjustment value of the first candidate tuning scene is no greater than an adjustment value of the target tuning scene, and an adjustment value of the second candidate tuning scene is no smaller than the adjustment value of the target tuning scene; and
   perform interpolation processing based on the adjustment value of the first candidate tuning scene, a tuning parameter corresponding to the adjustment value of the first candidate tuning scene, the adjustment value of the second candidate tuning scene, and a tuning parameter corresponding to the adjustment value of the second candidate tuning scene, to obtain the target tuning parameter of the target tuning scene.

In an embodiment, the first candidate tuning scene is a tuning scene with an adjustment value no greater than the adjustment value of the target tuning scene and with a maximum adjustment value in the preset tuning scenes; and
   the second candidate tuning scene is a tuning scene with an adjustment value no smaller than the adjustment value of the target tuning scene and with a minimum adjustment value in the preset tuning scenes.

In an embodiment, the parameter control module being configured to perform interpolation processing based on the adjustment value of the first candidate tuning scene, a tuning parameter corresponding to the adjustment value of the first candidate tuning scene, the adjustment value of the second candidate tuning scene, and a tuning parameter corresponding to the adjustment value of the second candidate tuning scene, to obtain the target tuning parameter of the target tuning scene includes:
   the parameter control module being configured to:
   determine the target tuning parameter of the target tuning scene according to the following formula (1):

$$P(Vt)=(Vt-Vi)/(Vj-Vi)*(P(Vj)-P(Vi))+P(Vi) \qquad (1)$$

where $P(Vt)$ denotes a target tuning parameter corresponding to an adjustment value $Vt$ of a target tuning scene t, $P(Vi)$ denotes a tuning parameter corresponding to an adjustment value $Vi$ of a first candidate tuning scene i, and $P(Vj)$ denotes a tuning parameter corresponding to an adjustment value $Vj$ of a second candidate tuning scene j.

In an embodiment, the parameter control module being configured to determine a target tuning parameter of a target tuning scene based on tuning parameters corresponding to preset tuning scenes includes:

the parameter control module being configured to:
obtain, based on the preset tuning scenes, tuning parameter estimates of key acoustic parameters through corresponding RIRs;
obtain an intermediate tuning parameter of the target tuning scene based on the tuning parameter estimates; and
obtain the target tuning parameter of the target tuning scene based on the intermediate tuning parameter and a pre-trained tuning parameter prediction model.

In an embodiment, the parameter control module being configured to obtain an intermediate tuning parameter of the target tuning scene based on the tuning parameter estimates includes:
the parameter control module being configured to:
select, from the preset tuning scenes, a first intermediate tuning scene and a second intermediate tuning scene based on the target tuning scene; wherein an adjustment value of the first intermediate tuning scene is no greater than an adjustment value of the target tuning scene, and an adjustment value of the second intermediate tuning scene is no smaller than the adjustment value of the target tuning scene; and
perform interpolation processing based on the adjustment value of the first intermediate tuning scene, a tuning parameter estimate corresponding to the adjustment value of the first intermediate tuning scene, the adjustment value of the second intermediate tuning scene, and a tuning parameter estimate corresponding to the adjustment value of the second intermediate tuning scene, to obtain the intermediate tuning parameter of the target tuning scene.

In an embodiment, the audio processing system further includes a training module;
the training module being configured to train the tuning parameter prediction model according to the following steps:
generating training data based on the tuning parameters corresponding to preset tuning scenes and the tuning parameter estimates corresponding thereto; and
training the tuning parameter prediction model by taking the tuning parameter estimates in the training data as input and the tuning parameters in the training data as output, to obtain the pre-trained tuning parameter prediction model.

In an embodiment, the audio generation module includes:
a pre-processing unit configured to pre-process the input audio signal based on a pre-processing parameter in the target tuning parameter, to obtain a reverberation input signal;
a reverberation generation unit configured to reverberation the reverberation input signal based on a reverberation parameter in the target tuning parameter, and generate an initial reverberation audio signal of the target tuning scene;
a mixing unit configured to weight and mix, based on a weighted mixing parameter in the target tuning parameter, a dry sound signal in the input audio signal and the initial reverberation audio signal according to a preset ratio, to obtain an intermediate reverberation audio signal of the target tuning scene; and
a system tuning unit configured to perform system tuning on the intermediate reverberation audio signal based on a system tuning parameter in the target tuning parameter, to obtain the final reverberation audio signal of the target tuning scene.

In another aspect of the present disclosure, an electronic device is provided, including:
at least one processor; and
a memory in communication connection with the at least one processor; wherein
the memory stores instructions executable by the at least one processor, and the instructions are executed by the at least one processor to cause the at least one processor to perform the audio processing method described above.

BRIEF DESCRIPTION OF DRAWINGS

One or more embodiments will be illustrated with reference to the accompanying drawings corresponding thereto. These illustrations do not constitute limitations on the embodiments. In the companying drawing, elements with like reference numbers refer to like or similar elements. Unless specifically stated, the figures in the accompanying drawings do not constitute a scale limitation.

DESCRIPTION OF EMBODIMENTS

To make the objectives, technical solutions, and advantages of embodiments of the present disclosure clearer, the embodiments of the present disclosure will be described in detail below with reference to the accompanying drawings. However, it is to be understood by those skilled in the art that, in the various embodiments of the present disclosure, numerous technical details are set forth in order to provide a reader with a better understanding of the present disclosure. However, even without these technical details and various changes and modifications based on the following embodiments, the technical solutions claimed in the present disclosure may still be implemented. The following divisions of the various embodiments are for convenience of description and should not constitute any limitation on the specific implementation of the present disclosure. The various embodiments can be combined with each other and referred to each other provided that there is no contradiction.

Figure 1:
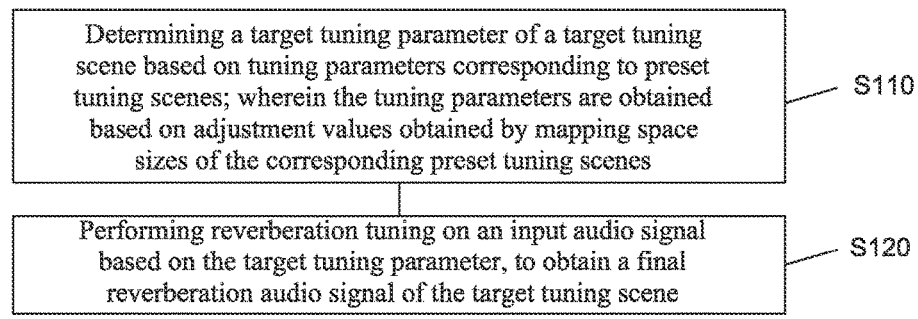
FIG. 1 is a flowchart of an audio processing method according to some embodiments of the present disclosure.

The present disclosure relate to an audio processing method. A process of the audio processing method is shown in FIG. 1, including the following steps.

In step S110, a target tuning parameter of a target tuning scene is determined based on tuning parameters corresponding to preset tuning scenes; in which the tuning parameters are obtained based on adjustment values obtained by mapping space sizes of the corresponding preset tuning scenes.

In an embodiment, the preset tuning scenes refer to a number of preset virtual acoustic scenes corresponding to different space sizes, such as a recording studio scene, a living room scene, a concert hall scene, and a football field scene.

For the preset mixing scenes, different audio processing operations have different types of audio processing parameters. For example, for pre-processing operations such as de-reverberation, EQ adjustment (equalization adjustment), and delay control, types of audio processing parameters involved include, but are not limited to, pre-processing parameters such as a degree of de-reverberation, key frequency points and gain values of an EQ curve, and delay time. For reverberation operations such as early reflection generation, late reverberation generation, and de-correlation, types of audio processing parameters involved include, but are not limited to, reverberation parameters such as delay time of early reflection and late reverberation, reverberation density, echo intensity, a room absorption coefficient, a filter frequency point and gain value, delay time of a delayer, and a degree of de-correlation. For operations such as mixing and system tuning, types of audio processing parameters involved include, but are not limited to, mixing parameters such as dry and wet sound ratios, and system tuning parameters such as multi-channel gain delay control. For example, if the preset tuning scenes involve a total of N audio processing parameters, parameter values corresponding thereto may be denoted as P={p1, p2, . . . , pN}, where p1, p2, . . . , pN respectively denote parameter values corresponding to $1^{st}$, $2^{nd}$, . . . , and $N^{th}$ audio processing parameters.

It is to be noted that the tuning parameters corresponding to the preset tuning scenes are obtained based on values, that is, the adjustment values, obtained by mapping space sizes of virtual acoustic scenes in the preset tuning scenes. For example, if the preset tuning scenes includes K virtual acoustic scenes and an adjustment value obtained by mapping a space size of any one virtual acoustic scene k (k=[1, 2 . . . , K]) is Vk, a tuning parameter corresponding to the virtual acoustic scene k may be denoted as P(Vk). A specific value of the adjustment value Vk may be set based on expert experience. For example, a corresponding adjustment value may be set for each virtual acoustic scene according to a size of a corresponding space. If the corresponding space is larger, the adjustment value of the corresponding virtual acoustic scene is greater. For example, a value range of the adjustment value corresponding to each virtual acoustic scene included in the preset tuning scenes may be set to [0, 1]. Then, when the preset tuning scenes include a recording studio scene (k=1), a living room scene (k=2), a concert hall scene (k=3), and a football field scene (k=4) according to corresponding space sizes, adjustment values corresponding to the scenes may be expressed as V1=0, V2=0.3, V3=0.7, and V4=1 respectively.

The target tuning scene may be specified by a user based on the preset tuning scenes. For example, when the preset tuning scenes include virtual acoustic scenes such as a recording studio scene, a living room scene, a concert hall scene, and a football field scene, the target tuning scene may be any one of the virtual acoustic scenes such as the recording studio scene, the living room scene, the concert hall scene, and the football field scene.

The target tuning parameter of the target tuning scene refers to an audio processing parameter required to be adjusted to simulate a reverberation effect in the target tuning scene based on an input audio signal, including, but not limited to, one or more audio processing parameter involved in operations such as a pre-processing operation, a reverberation operation, and mixing and system tuning. On this basis, in step S110, after the tuning parameter P(Vk) is determined based on the space sizes of the preset tuning scenes, the target tuning parameter of the target tuning scene may be determined according to a preset relationship between P(Vk) and the target tuning parameter of the target tuning scene, such as a linear relationship or a non-linear relationship, so as to simulate reverberation effects of different target tuning scenes according to the space sizes of the preset tuning scenes.

In step S120, reverberation tuning is performed on an input audio signal based on the target tuning parameter, to obtain a final reverberation audio signal of the target tuning scene.

In an embodiment, after the target tuning parameter of the target tuning scene is obtained, in step S120, a corresponding audio processing operation may be performed on the input audio signal according to one or more of the audio processing parameters involved in the target tuning parameter, such as a pre-processing parameter, a reverberation processing parameter, and a mixing and system tuning processing parameter, to obtain the final reverberation audio signal that simulates a reverberation effect in the target tuning scene.

For example, when performing reverberation tuning on an input audio signal based on the target tuning parameter, step S120 may include: pre-processing the input audio signal based on a pre-processing parameter in the target tuning parameter, to obtain a reverberation input signal; reverbing the reverberation input signal based on a reverberation parameter in the target tuning parameter, and generating an initial reverberation audio signal of the target tuning scene; weighting and mixing, based on a weighted mixing parameter in the target tuning parameter, a dry sound signal in the input audio signal and the initial reverberation audio signal according to a preset ratio, to obtain an intermediate reverberation audio signal of the target tuning scene; and performing system tuning on the intermediate reverberation audio signal based on a system tuning parameter in the target tuning parameter, to obtain the final reverberation audio signal of the target tuning scene.

In an embodiment, the weighted mixing parameter herein includes, but is not limited to, parameters such as dry and wet sound ratios. When the dry sound signal in the input audio signal and the initial reverberation audio signal are weighted and mixed according to the preset ratio, first, dry and wet sound separation may be performed on the input audio signal, and then the dry sound signal and the initial reverberation audio signal obtained by separation are weighted and mixed according to a preset ratio such as 1:1, 1.1:0.8, or 0.7:1.2, thereby obtaining the intermediate reverberation audio signal.

It is to be noted that the audio processing method provided in this embodiment is applicable to simulation of reverberation effects of different types of virtual acoustic scenes with different space sizes, such as a recording studio scene, a living room scene, a concert hall scene, and a football field scene, and is also applicable to simulation of reverberation effects of a same type of virtual acoustic scenes with different space sizes, such as simulation of reverberation effects of concert hall scenes with different space sizes.

Compared with the related art, in the audio processing method provided in this embodiment, the target tuning parameter of the target tuning scene is determined by using the tuning parameters corresponding to the adjustment values obtained by mapping based on a space sizes of the preset tuning scenes, and reverberation tuning is performed on the input audio signal based on the target tuning parameter, to obtain the final reverberation audio signal of the target tuning scene. For a target tuning scene required to be simulated, any audio processing parameter can be adjusted and controlled based on a corresponding space size, thereby realizing simulation of reverberation effects of target tuning scenes with different space sizes and further meeting more abundant and more flexible requirements for simulation of reverberation effects of virtual scenes.

For example, step S110 includes: selecting, from the preset tuning scenes, a first candidate tuning scene and a second candidate tuning scene based on the target tuning scene; in which an adjustment value of the first candidate tuning scene is no greater than an adjustment value of the target tuning scene, and an adjustment value of the second candidate tuning scene is no smaller than the adjustment value of the target tuning scene; and performing interpolation processing based on the adjustment value of the first candidate tuning scene, a tuning parameter corresponding to the adjustment value of the first candidate tuning scene, the adjustment value of the second candidate tuning scene, and a tuning parameter corresponding to the adjustment value of the second candidate tuning scene, to obtain the target tuning parameter of the target tuning scene.

In an embodiment, if an adjustment value of a target tuning scene t obtained by mapping based on a space size is denoted as $Vt$, an adjustment value of a first candidate tuning scene i obtained by mapping based on a space size is denoted as $Vi$, and an adjustment value of a second candidate tuning scene j obtained by mapping based on a space size is denoted as $Vj$, $Vi <= Vt <= Vj$ is satisfied. Correspondingly, a tuning parameter of the first candidate tuning scene i may be denoted as $P(Vi)$, and a tuning parameter of the second candidate tuning scene j may be denoted as $P(Vj)$. On this basis, by interpolation processing on tuning parameters based on $Vi$, $Vj$, $P(Vi)$, and $P(Vj)$, a target tuning parameter $P(Vt)$ when the target tuning scene t corresponds to the adjustment value $Vt$ may be obtained.

It is to be noted that the specific manner of interpolation processing is not limited in this embodiment. For example, interpolation processing herein may include, but is not limited to, one or more of linear interpolation, nearest neighbor interpolation, polynomial interpolation, spline interpolation, and least squares interpolation. For example, in this embodiment, interpolation processing may be performed based on all adjustment values of the first candidate tuning scene and the second candidate tuning scene and the tuning parameters corresponding thereto in any one of the interpolation processing manners such as linear interpolation, nearest neighbor interpolation, polynomial interpolation, spline interpolation, and least squares interpolation. Alternatively, in this embodiment, interpolation processing may be performed based on part of the adjustment values of the first candidate tuning scene and the second candidate tuning scene and the tuning parameters corresponding thereto by linear interpolation, and at the same time, interpolation processing is performed based on the remaining adjustment values of the first candidate tuning scene and the second candidate tuning scene and the tuning parameters corresponding thereto in any one of nearest neighbor interpolation, polynomial interpolation, spline interpolation, and least squares interpolation.

For example, the performing interpolation processing based on the adjustment value of the first candidate tuning scene, a tuning parameter corresponding to the adjustment value of the first candidate tuning scene, the adjustment value of the second candidate tuning scene, and a tuning parameter corresponding to the adjustment value of the second candidate tuning scene, to obtain the target tuning parameter of the target tuning scene includes: determining the target tuning parameter of the target tuning scene according to the following formula (1):

$$P(Vt) = (Vt - Vi)/(Vj - Vi) * (P(Vj) - P(Vi)) + P(Vi) \quad (1)$$

where $P(Vt)$ denotes a target tuning parameter corresponding to an adjustment value $Vt$ of a target tuning scene t, $P(Vi)$ denotes a tuning parameter corresponding to an adjustment value $Vi$ of a first candidate tuning scene i, and $P(Vj)$ denotes a tuning parameter corresponding to an adjustment value $Vj$ of a second candidate tuning scene j.

In this embodiment, the target tuning parameter of the target tuning scene is obtained by interpolation processing on parameters by using the adjustment values obtained by mapping space sizes of the first candidate tuning scene and the second candidate tuning scene and the tuning parameters corresponding thereto, so that the final reverberation audio signal obtained by reverberation tuning on the input audio signal based on the target tuning parameter can be closer to a real reverberation audio signal corresponding to the target tuning scene, which is simple and effective and also further improves a simulated reverberation effect of the target tuning scene.

For example, to make the final reverberation audio signal of the target tuning scene closer to the real reverberation audio signal corresponding to the target tuning scene, the first candidate tuning scene may be set to a virtual acoustic scene, i.e., a tuning scene, with an adjustment value no greater than the adjustment value of the target tuning scene and with a maximum adjustment value in the preset tuning scenes, and the second candidate tuning scene is set to a virtual acoustic scene, i.e., a tuning scene, with an adjustment value no smaller than the adjustment value of the target tuning scene and with a minimum adjustment value in the preset tuning scenes, thereby further improving the simulated reverberation effect of the target tuning scene.

It is to be noted that, in addition to determining the target tuning parameter of the target tuning scene by interpolation, the target tuning parameter of the target tuning scene may also be determined by using a neural network model, so as to simulate a mutually coupled complex nonlinear relationship between different audio processing parameters included in the target tuning parameter through the neural network model, thereby further improving the simulated reverberation effect of the target tuning scene.

For example, when determining the target tuning parameter of the target tuning scene by using a neural network model, step S110 may include: obtaining, based on the preset tuning scenes, tuning parameter estimates of key acoustic parameters through corresponding RIRs; obtaining an intermediate tuning parameter of the target tuning scene based on the tuning parameter estimates; and obtaining the target tuning parameter of the target tuning scene based on the intermediate tuning parameter and a pre-trained tuning parameter prediction model.

In an embodiment, the key acoustic parameters herein refer to acoustic parameters that can affect spatial perception, which may include, but are not limited to, a total reverberation duration, reverberation durations in different frequency bands, delay between early reverberation and late reverberation, late reverberation density, inter-channel correlation coefficients, and the like. For different virtual acoustic scenes in the preset tuning scenes, tuning parameter estimates of key acoustic parameters corresponding thereto, that is, estimates of the key acoustic parameters, are also different.

When the tuning parameter estimates of the key acoustic parameters are determined based on the preset tuning scenes, a unit impulse signal may be inputted for each virtual acoustic scene in the preset tuning scenes, corresponding RIRs is obtained by setting different audio processing parameter values P, and then estimates Q of corresponding key acoustic parameters are obtained based on the RIRs through a measurement algorithm.

It is to be noted that the intermediate tuning parameter herein refers to a tuning parameter determined based on the adjustment values obtained by mapping space sizes of virtual acoustic scenes in the preset tuning scenes, such as a recording studio scene, a living room scene, a concert hall scene, and a football field scene. For example, for a virtual acoustic scene k in the preset tuning scenes, when an adjustment value obtained by mapping according to the space size is Vk, an intermediate tuning parameter corresponding to the virtual acoustic scene may be denoted as Q(Vk).

For example, the obtaining an intermediate tuning parameter of the target tuning scene based on the tuning parameter estimates includes: selecting, from the preset tuning scenes, a first intermediate tuning scene and a second intermediate tuning scene based on the target tuning scene; in which an adjustment value of the first intermediate tuning scene is no greater than an adjustment value of the target tuning scene, and an adjustment value of the second intermediate tuning scene is no smaller than the adjustment value of the target tuning scene; and performing interpolation processing based on the adjustment value of the first intermediate tuning scene, a tuning parameter estimate corresponding to the adjustment value of the first intermediate tuning scene, the adjustment value of the second intermediate tuning scene, and a tuning parameter estimate corresponding to the adjustment value of the second intermediate tuning scene, to obtain the intermediate tuning parameter of the target tuning scene.

In an embodiment, if an adjustment value of a target tuning scene t obtained by mapping based on a space size is denoted as Vt, an adjustment value of a first intermediate tuning scene x obtained by mapping based on a space size is denoted as Vx, and an adjustment value of a second intermediate tuning scene y obtained by mapping based on a space size is denoted as Vy, Vx<=Vt<=Vy is satisfied. Correspondingly, a tuning parameter estimate of the first intermediate tuning scene x may be denoted as Q(Vx), and a tuning parameter estimate of the second intermediate tuning scene y may be denoted as Q(Vy). On this basis, by interpolation processing on tuning parameters based on Vx, Vy, Q(Vx), and Q(Vy), an intermediate tuning parameter Q(Vt) when the target tuning scene t corresponds to the adjustment value Vt may be obtained.

Referring to the above formula (1), when the intermediate tuning parameter of the target tuning scene t is determined by interpolation, the intermediate tuning parameter Q(Vt) when the target tuning scene t corresponds to the adjustment value Vt may be expressed as the following formula (2):

$$Q(Vt) = (Vt - Vx)/(Vy - Vx) * (Q(Vy) - Q(Vx)) + Q(Vx) \qquad (2)$$

It is to be noted that, to make the final reverberation audio signal of the target tuning scene closer to the real reverberation audio signal corresponding to the target tuning scene, the first intermediate tuning scene may be set to a virtual acoustic scene, i.e., a tuning scene, with an adjustment value no greater than the adjustment value of the target tuning scene and with a maximum adjustment value in the preset tuning scenes, and the second intermediate tuning scene is set to a virtual acoustic scene, i.e., a tuning scene, with an adjustment value no smaller than the adjustment value of the target tuning scene and with a minimum adjustment value in the preset tuning scenes, thereby further improving the simulated reverberation effect of the target tuning scene.

For example, the tuning parameter prediction model is trained according to the following steps: generating training data based on the tuning parameters corresponding to preset tuning scenes and the tuning parameter estimates corresponding thereto; and training the tuning parameter prediction model by taking the tuning parameter estimates in the training data as input and the tuning parameters in the training data as output, to obtain the pre-trained tuning parameter prediction model.

In an embodiment, when the tuning parameter prediction model is trained, a tuning parameter P(Vk) of a virtual acoustic scene k in the preset tuning scenes and a tuning parameter estimate Q(Vk) corresponding thereto may form a data pair {P, Q}, training data is generated based on a large number of data pairs {P, Q} corresponding to the virtual acoustic scenes, and then the tuning parameter prediction model constructed based on the neural network model is trained by taking Q in the data pairs {P, Q} as input of the tuning parameter prediction model and P in the data pairs {P, Q} as output of the tuning parameter prediction model, to obtain a pre-trained tuning parameter prediction model F( ). A mapping relationship between P and Q may be expressed as P=F(Q).

It is to be noted that the specific type of the neural network model used to construct the tuning parameter prediction model is not limited in this embodiment, which may be selected by those skilled in the art according to an actual requirement.

After the pre-trained tuning parameter prediction model F( ) is obtained, based on the mapping relationship P=F(Q) between P and Q, a target tuning parameter P(Vt) corresponding to the adjustment value Vt of the target tuning scene t may be obtained based on the intermediate tuning parameter Q(Vt) when the target tuning scene t corresponds to the adjustment value Vt and F( ) that is, P(Vt)=F(Q(Vt)).

Figure 2:
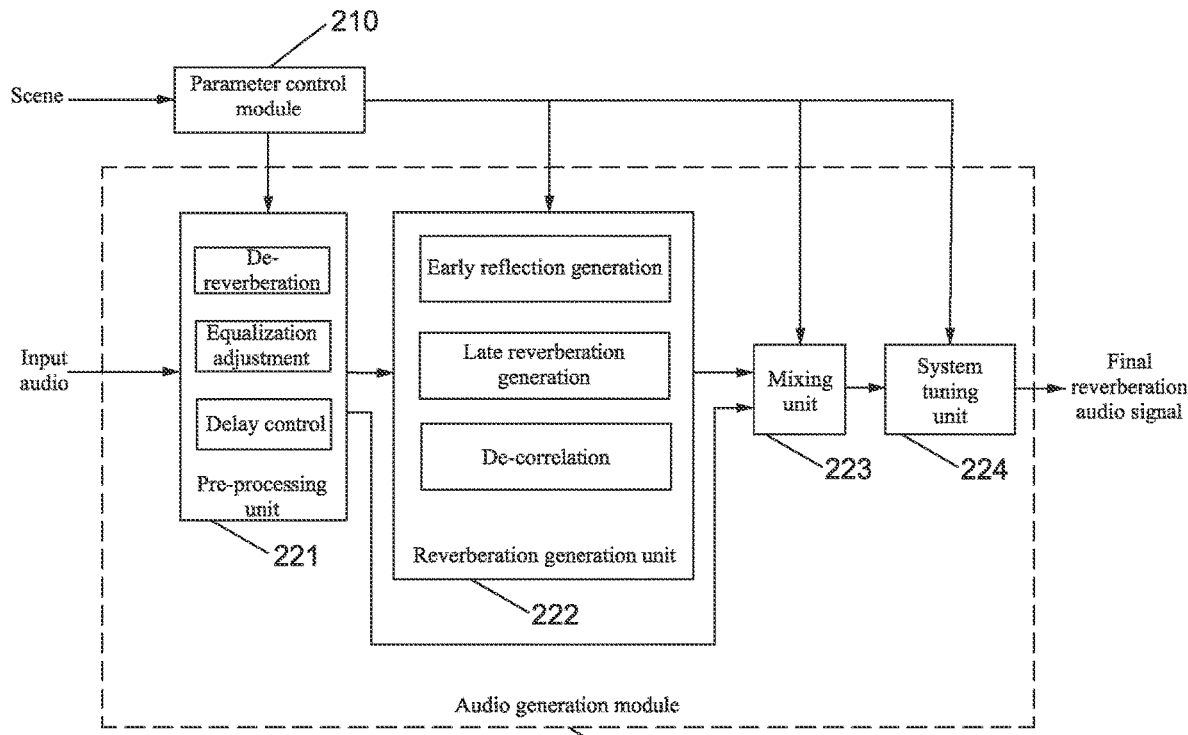
FIG. 2 is a schematic structural diagram of an audio processing system according to some embodiments of the present disclosure.

Some embodiments of the present disclosure relate to an audio processing system, which, as shown in FIG. 2, includes:

a parameter control module 210 configured to determine a target tuning parameter of a target tuning scene based on tuning parameters corresponding to preset tuning scenes; in which the tuning parameters are obtained based on adjustment values obtained by mapping space sizes of the corresponding preset tuning scenes; and an audio generation module 220 configured to perform reverberation tuning on an input audio signal based on the target tuning parameter, to obtain a final reverberation audio signal of the target tuning scene.

Compared with the related art, in the audio processing system provided in this embodiment, the parameter control module determines the target tuning parameter of the target tuning scene by using the tuning parameters corresponding to the adjustment values obtained by mapping based on a space sizes of the preset tuning scenes, and the audio generation module performs reverberation tuning on the input audio signal based on the target tuning parameter, to obtain the final reverberation audio signal of the target tuning scene. For a target tuning scene required to be simulated, any audio processing parameter can be adjusted and controlled based on a corresponding space size, thereby realizing simulation of reverberation effects of target tuning scenes with different space sizes and further meeting more abundant and more flexible requirements for simulation of reverberation effects of virtual scenes.

In some embodiments, the parameter control module 210 being configured to determine a target tuning parameter of a target tuning scene based on tuning parameters corresponding to preset tuning scenes includes:

the parameter control module 210 being configured to: select, from the preset tuning scenes, a first candidate tuning scene and a second candidate tuning scene based on the target tuning scene; in which an adjustment value of the first candidate tuning scene is no greater than an adjustment value of the target tuning scene, and an adjustment value of the second candidate tuning scene is no smaller than the adjustment value of the target tuning scene; and perform interpolation processing based on the adjustment value of the first candidate tuning scene, a tuning parameter corresponding to the adjustment value of the first candidate tuning scene, the adjustment value of the second candidate tuning scene, and a tuning parameter corresponding to the adjustment value of the second candidate tuning scene, to obtain the target tuning parameter of the target tuning scene.

For example, the first candidate tuning scene is a tuning scene with an adjustment value no greater than the adjustment value of the target tuning scene and with a maximum adjustment value in the preset tuning scenes. The second candidate tuning scene is a tuning scene with an adjustment value no smaller than the adjustment value of the target tuning scene and with a minimum adjustment value in the preset tuning scenes.

For example, the parameter control module 210 being configured to perform interpolation processing based on the adjustment value of the first candidate tuning scene, a tuning parameter corresponding to the adjustment value of the first candidate tuning scene, the adjustment value of the second candidate tuning scene, and a tuning parameter corresponding to the adjustment value of the second candidate tuning scene, to obtain the target tuning parameter of the target tuning scene includes:

the parameter control module 210 being configured to determine the target tuning parameter of the target tuning scene according to the following formula (1):

$$P(Vt) = (Vt - Vi)/(Vj - Vi) * (P(Vj) - P(Vi)) + P(Vi) \quad (1)$$

where P(Vt) denotes a target tuning parameter corresponding to an adjustment value Vt of a target tuning scene t, P(Vi) denotes a tuning parameter corresponding to an adjustment value Vi of a first candidate tuning scene i, and P(Vj) denotes a tuning parameter corresponding to an adjustment value Vj of a second candidate tuning scene j.

In some embodiments, the parameter control module 210 being configured to determine a target tuning parameter of a target tuning scene based on tuning parameters corresponding to preset tuning scenes includes:

the parameter control module 210 being configured to obtaining, based on the preset tuning scenes, tuning parameter estimates of key acoustic parameters through corresponding RIRs; obtaining an intermediate tuning parameter of the target tuning scene based on the tuning parameter estimates; and obtaining the target tuning parameter of the target tuning scene based on the intermediate tuning parameter and a pre-trained tuning parameter prediction model.

For example, the parameter control module 210 being configured to obtain an intermediate tuning parameter of the target tuning scene based on the tuning parameter estimates includes:

the parameter control module 210 being configured to: select, from the preset tuning scenes, a first intermediate tuning scene and a second intermediate tuning scene based on the target tuning scene; in which an adjustment value of the first intermediate tuning scene is no greater than an adjustment value of the target tuning scene, and an adjustment value of the second intermediate tuning scene is no smaller than the adjustment value of the target tuning scene; and perform interpolation processing based on the adjustment value of the first intermediate tuning scene, a tuning parameter estimate corresponding to the adjustment value of the first intermediate tuning scene, the adjustment value of the second intermediate tuning scene, and a tuning parameter estimate corresponding to the adjustment value of the second intermediate tuning scene, to obtain the intermediate tuning parameter of the target tuning scene.

For example, the audio processing system further includes a training module. The training module is configured to train the tuning parameter prediction model through the following steps: generate training data based on the tuning parameters corresponding to preset tuning scenes and the tuning parameter estimates corresponding thereto; and train the tuning parameter prediction model by taking the tuning parameter estimates in the training data as input and the tuning parameters in the training data as output, to obtain the pre-trained tuning parameter prediction model.

For example, as shown in FIG. 2, the audio generation module 220 includes a pre-processing unit 221, a reverberation generation unit 222, a mixing unit 223, and a system tuning unit 224.

The pre-processing unit 221 is configured to pre-process the input audio signal based on a pre-processing parameter in the target tuning parameter, to obtain a reverberation input signal. The pre-processing includes, but is not limited to, operations such as de-reverberation, equalization adjustment, and delay control.

The reverberation generation unit 222 is configured to reverberation the reverberation input signal based on a reverberation parameter in the target tuning parameter, and generate an initial reverberation audio signal of the target tuning scene. The reverbing includes, but is not limited to, reverberation operations such as early reflection generation, late reverberation generation, and de-correlation.

The mixing unit 223 is configured to weight and mix, based on a weighted mixing parameter in the target tuning parameter, a dry sound signal in the input audio signal and the initial reverberation audio signal according to a preset ratio, to obtain an intermediate reverberation audio signal of the target tuning scene.

The system tuning unit 224 is configured to perform system tuning on the intermediate reverberation audio signal based on a system tuning parameter in the target tuning parameter, to obtain the final reverberation audio signal of the target tuning scene.

A specific implementation method for the audio processing system provided in some embodiments of the present disclosure may be obtained with reference to the audio processing method provided in some embodiments of the present disclosure.

Figure 3:
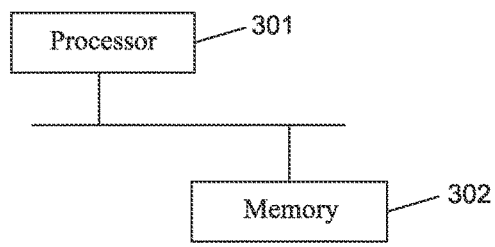
FIG. 3 is a schematic structural diagram of an electronic device according to some embodiments of the present disclosure.

The present disclosure provides an electronic device. As shown in FIG. 3, the electronic device includes:
at least one processor 301; and
a memory 302 in communication connection with the at least one processor 301; in which
the memory 302 stores instructions executable by the at least one processor 301, and the instructions are executed by the at least one processor 301 to cause the at least one processor 301 to perform the audio processing method described above.

The memory and the processor are connected by using a bus. The bus may include any quantity of interconnected buses and bridges. The bus connects various circuits of one or more processors and memories together. The bus may further connect together various other circuits such as a peripheral device, a voltage regulator, and a power management circuit, which is well known in the art, and therefore is not further described herein. A bus interface is provided between the bus and a transceiver. The transceiver may be one or more elements, such as a plurality of receivers and transmitters, providing a unit configured to communicate with various other apparatuses over a transmission medium. Data processed by the processor is transmitted over a wireless medium via an antenna. Further, the antenna may receive the data and send the data to the processor.

The processor is responsible for managing the bus and routine processing, and may further provides various functions, including timing, peripheral interfaces, voltage regulation, power management, and other control functions. The memory may be configured to store data used by the processor when performing operations.

Those of ordinary skill in the art may understand that the above embodiments are specific implementations for implementing the present disclosure, and in actual applications, various changes may be made in form and details without departing from the spirit and spirit of the present disclosure.

What is claimed is:

1. An audio processing method, comprising:
determining a target tuning parameter of a target tuning scene based on tuning parameters corresponding to preset tuning scenes, wherein the tuning parameters are obtained based on adjustment values obtained by mapping space sizes of the corresponding preset tuning scenes; and
performing reverberation tuning on an input audio signal based on the target tuning parameter, to obtain a final reverberation audio signal of the target tuning scene,
wherein the determining a target tuning parameter of a target tuning scene based on tuning parameters corresponding to preset tuning scenes comprises:
selecting, from the preset tuning scenes, a first candidate tuning scene and a second candidate tuning scene based on the target tuning scene, wherein an adjustment value of the first candidate tuning scene is no greater than an adjustment value of the target tuning scene, and an adjustment value of the second candidate tuning scene is no smaller than the adjustment value of the target tuning scene; and
performing interpolation processing based on the adjustment value of the first candidate tuning scene, a tuning parameter corresponding to the adjustment value of the first candidate tuning scene, the adjustment value of the second candidate tuning scene, and a tuning parameter corresponding to the adjustment value of the second candidate tuning scene, to obtain the target tuning parameter of the target tuning scene.

2. The audio processing method as described in claim 1, wherein
the first candidate tuning scene is a tuning scene with an adjustment value no greater than the adjustment value of the target tuning scene and with a maximum adjustment value in the preset tuning scenes; and
the second candidate tuning scene is a tuning scene with an adjustment value no smaller than the adjustment value of the target tuning scene and with a minimum adjustment value in the preset tuning scenes.

3. The audio processing method as described in claim 1, wherein
the performing interpolation processing based on the adjustment value of the first candidate tuning scene, a tuning parameter corresponding to the adjustment value of the first candidate tuning scene, the adjustment value of the second candidate tuning scene, and a tuning parameter corresponding to the adjustment value of the second candidate tuning scene, to obtain the target tuning parameter of the target tuning scene, comprises:
determining the target tuning parameter of the target tuning scene according to the following formula (1):

$$P_{[i\alpha]}(Vt) = (Vt - Vi)/(Vj - Vi) * (P_{[i\alpha]}(Vj) - P_{[i\alpha]}(Vi)) + P_{[i\alpha]}(Vi) \quad (1)$$

where P(Vt) denotes a target tuning parameter corresponding to an adjustment value Vt of a target tuning scene t, P(Vi) denotes a tuning parameter corresponding to an adjustment value Vi of a first candidate tuning scene i, and P(Vj) denotes a tuning parameter corresponding to an adjustment value Vj of a second candidate tuning scene j.

4. The audio processing method as described in claim 1, wherein the determining a target tuning parameter of a target tuning scene based on tuning parameters corresponding to preset tuning scenes comprises:
obtaining, based on the preset tuning scenes, tuning parameter estimates of key acoustic parameters through corresponding room impulse responses (RIRs);
obtaining an intermediate tuning parameter of the target tuning scene based on the tuning parameter estimates; and
obtaining the target tuning parameter of the target tuning scene based on the intermediate tuning parameter and a pre-trained tuning parameter prediction model.

5. The audio processing method as described in claim 4, wherein the obtaining an intermediate tuning parameter of the target tuning scene based on the tuning parameter estimates comprises:
selecting, from the preset tuning scenes, a first intermediate tuning scene and a second intermediate tuning scene based on the target tuning scene, wherein an adjustment value of the first intermediate tuning scene is no greater than an adjustment value of the target tuning scene, and an adjustment value of the second intermediate tuning scene is no smaller than the adjustment value the target tuning scene; and
performing interpolation processing based on the adjustment value of the first intermediate tuning scene, a tuning parameter estimate corresponding to the adjustment value of the first intermediate tuning scene, the adjustment value of the second intermediate tuning scene, and a tuning parameter estimate corresponding to the adjustment value of the second intermediate tuning scene, to obtain the intermediate tuning parameter of the target tuning scene.

6. The audio processing method as described in claim 4, wherein the tuning parameter prediction model is trained according to the following steps:
generating training data based on the tuning parameters corresponding to preset tuning scenes and the tuning parameter estimates corresponding thereto; and
training the tuning parameter prediction model by taking the tuning parameter estimates in the training data as input and the tuning parameters in the training data as output, to obtain the pre-trained tuning parameter prediction model.

7. The audio processing method as described in claim 1, wherein the performing reverberation tuning on an input audio signal based on the target tuning parameter, to obtain a final reverberation audio signal of the target tuning scene comprises:
pre-processing the input audio signal based on a pre-processing parameter in the target tuning parameter, to obtain a reverberation input signal;
reverbing the reverberation input signal based on a reverberation parameter in the target tuning parameter, and generating an initial reverberation audio signal of the target tuning scene;
weighting and mixing, based on a weighted mixing parameter in the target tuning parameter, a dry sound signal in the input audio signal and the initial reverberation audio signal according to a preset ratio, to obtain an intermediate reverberation audio signal of the target tuning scene; and
performing system tuning on the intermediate reverberation audio signal based on a system tuning parameter in the target tuning parameter, to obtain the final reverberation audio signal of the target tuning scene.

8. An audio processing system, comprising:
a parameter control module configured to determine a target tuning parameter of a target tuning scene based on tuning parameters corresponding to preset tuning scenes, wherein the tuning parameters are obtained based on adjustment values obtained by mapping space sizes of the corresponding preset tuning scenes; and
an audio generation module configured to perform reverberation tuning on an input audio signal based on the target tuning parameter, to obtain a final reverberation audio signal of the target tuning scene,
wherein the parameter control module to determine a target tuning parameter of a target tuning scene based on tuning parameters corresponding to preset tuning scenes is configured to:
select, from the preset tuning scenes, a first candidate tuning scene and a second candidate tuning scene based on the target tuning scene, wherein an adjustment value of the first candidate tuning scene is no greater than an adjustment value of the target tuning scene, and an adjustment value of the second candidate tuning scene is no smaller than the adjustment value of the target tuning scene; and
perform interpolation processing based on the adjustment value of the first candidate tuning scene, a tuning parameter corresponding to the adjustment value of the first candidate tuning scene, the adjustment value of the second candidate tuning scene, and a tuning parameter corresponding to the adjustment value of the second candidate tuning scene, to obtain the target tuning parameter of the target tuning scene.

9. An electronic device, comprising:
at least one processor; and
a memory in communication connection with the at least one processor;
wherein the memory stores instructions executable by the at least one processor, and the instructions are executed by the at least one processor to cause the at least one processor to perform the audio processing method as described in claim 1.

* * * * *